(12) United States Patent  
Campbell et al.

(10) Patent No.: US 8,748,856 B2  
(45) Date of Patent: Jun. 10, 2014

(54) COMPACT PROXIMITY SENSOR SUPPRESSING INTERNAL REFLECTION

(75) Inventors: Colin Campbell, Strataulen (GB); Ewan Findlay, Dollar (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 299 days.

(21) Appl. No.: 13/242,271

(22) Filed: Sep. 23, 2011

(65) Prior Publication Data

US 2012/0132793 A1    May 31, 2012

(30) Foreign Application Priority Data

Nov. 30, 2010 (GB) .................................. 1020281.0

(51) Int. Cl.  
*H01J 40/14* (2006.01)  
*H01L 31/12* (2006.01)

(52) U.S. Cl.  
USPC .......................................... 250/551; 250/221

(58) Field of Classification Search  
USPC .......................................... 250/221, 551, 239  
See application file for complete search history.

(56) References Cited

U.S. PATENT DOCUMENTS

| | | | |
|---|---|---|---|
| 4,835,595 A * | 5/1989 | Oho et al. ................ 250/551 |
| 4,972,089 A | 11/1990 | Stevenson | |
| 5,130,531 A | 7/1992 | Ito et al. | |
| 5,340,993 A * | 8/1994 | Salina et al. ............. 250/551 |
| 5,382,810 A | 1/1995 | Isaksson | |
| 5,448,395 A | 9/1995 | Lopez et al. | |
| 5,684,294 A | 11/1997 | Kouhi | |
| 6,594,043 B1 * | 7/2003 | Bloom et al. ............ 398/15 |
| 7,123,154 B1 | 10/2006 | Smith | |
| 7,161,136 B1 * | 1/2007 | Wenstrand et al. ...... 250/221 |
| 7,196,316 B2 * | 3/2007 | Chan et al. ............... 250/221 |
| 7,262,402 B2 | 8/2007 | Niclass et al. | |
| 7,309,855 B2 | 12/2007 | Nagasaka et al. | |
| 7,375,803 B1 | 5/2008 | Bamji | |
| 7,554,076 B2 * | 6/2009 | Wang et al. .............. 250/221 |
| 7,617,980 B2 * | 11/2009 | Saxena et al. ........... 235/454 |
| 2004/0012029 A1 | 1/2004 | Bawolek et al. | |
| 2006/0091293 A1 | 5/2006 | Grueger et al. | |

(Continued)

FOREIGN PATENT DOCUMENTS

DE    10201746 A1    8/2002  
EP    1351319 A2    10/2003

(Continued)

OTHER PUBLICATIONS

UK Search Report mailed Mar. 23, 2011 for GB 1020281.0 (1 page).

(Continued)

*Primary Examiner* — Tony Ko  
(74) *Attorney, Agent, or Firm* — Gardere Wynne Sewell LLP

(57) ABSTRACT

A proximity sensor includes a sensor package having an attachment pad with a radiation source and a radiation detector housed within the sensor package. The source and the detector are held in a fixed relation to the attachment pad, and are mounted by one of a direct or indirect attachment to the attachment pad. A portion of the attachment pad is adapted to form a baffle which forms at least part of an optical isolator. The optical isolator is adapted to substantially prevent the internal propagation of radiation between the source and the detector within the sensor package.

35 Claims, 10 Drawing Sheets

(56) References Cited

U.S. PATENT DOCUMENTS

| | | |
|---|---|---|
| 2006/0146330 A1 | 7/2006 | Maniam |
| 2007/0212681 A1 | 9/2007 | Shapiro et al. |
| 2008/0006762 A1 | 1/2008 | Fadell et al. |
| 2008/0219672 A1 | 9/2008 | Tam et al. |
| 2009/0219432 A1 | 9/2009 | Palum et al. |
| 2009/0302329 A1 | 12/2009 | Noma et al. |
| 2010/0085468 A1 | 4/2010 | Park et al. |
| 2010/0127159 A1 | 5/2010 | Watanabe |
| 2010/0277075 A1 | 11/2010 | Rees |
| 2010/0282953 A1 | 11/2010 | Tam |
| 2011/0086676 A1 | 4/2011 | Choi et al. |
| 2012/0087645 A1 | 4/2012 | Wu et al. |

FOREIGN PATENT DOCUMENTS

| | | |
|---|---|---|
| EP | 1764835 A1 | 3/2007 |
| JP | 10154825 A | 6/1998 |
| JP | 11261493 A | 9/1999 |
| JP | 11289105 A | 10/1999 |
| WO | WO-2009022282 A2 | 2/2009 |
| WO | WO-2009120568 A2 | 10/2009 |
| WO | WO-2010032306 A1 | 3/2010 |

OTHER PUBLICATIONS

English language translation of Abstract and Detailed Description of JP11261493A (8 pages).

* cited by examiner

COMPACT PROXIMITY SENSOR SUPPRESSING INTERNAL REFLECTION

PRIORITY CLAIM

This application claims priority from United Kingdom Application for Patent No. 1020281.0 filed Nov. 30, 2010, the disclosure of which is hereby incorporated by reference.

TECHNICAL FIELD

The invention relates to a proximity sensor and a method of manufacturing a proximity sensor.

BACKGROUND

Proximity sensors typically comprise a radiation source and a corresponding detector, the detector comprising a relatively small number of exposed light sensitive pixels (from a single pixel up to, for example, a 10×10 pixel array). At its simplest the proximity sensor is capable of indicating the presence or absence of a user or object. Additional computation and illuminator complexity can provide enhanced data such as the range to an object.

Proximity sensing is achieved by: emitting light from the radiation source; capturing light which is reflected back to the detector by an object; and processing the reflected light to determine the proximity of the object to the sensor. Proximity sensors are also used in many applications, including on mobile communications devices and vehicle parking sensors.

The source and the detector are typically provided in separate packages with separate control circuitry. It is desirable to reduce the size and complexity of these proximity sensors.

SUMMARY

A first aspect of the disclosure provides a proximity sensor comprising: a sensor package having an attachment pad; a radiation source and a radiation detector housed within the sensor package, the source and the detector being held in a fixed relation to the attachment pad, wherein a portion of the attachment pad is adapted to form a baffle which forms at least part of an optical isolator, the optical isolator substantially preventing the internal propagation of radiation between the source and the detector within the sensor package wherein the source and the detector may be mounted either directly or indirectly on the attachment pad.

Where the source and/or detector are indirectly mounted to the pad, the source and/or detector may be directly mounted on a further part of the sensor package which is in turn attached to (or integrally formed with) the pad. For example, the source and/or detector may be mounted on respective interposers which are in turn mounted on the attachment pad. In one embodiment, the interposer(s) may be angled to help angle the emission cone of the source and/or the incident cone of the detector in required directions.

Where the source and/or detector are directly mounted on the attachment pad, they may optionally be held on the pad by adhesive.

The baffle forms at least part of an optical isolator which substantially prevents the internal propagation of radiation between the source and the detector within the sensor package. This allows radiation emitted by the source, which has subsequently been reflected by an object outside the sensor package, to be reliably detected by the detector for proximity sensing, even when the radiation source and detector are housed within the same package. Packaging the source and the detector together allows close control of the source by circuitry packaged within the detector. In addition, the single proximity sensor package can be provided to a customer as a single working entity. It is also noted that, by adapting a portion of the pad, the baffle can be formed with minimal extra cost using existing manufacturing techniques (such as stamping).

Preferably the attachment pad is substantially planar. In this case, the baffle typically extends out from the plane of the pad.

In a preferred embodiment, the baffle is formed from material partially cut out from the pad. In this case, where the pad is substantially planar, the partially cut out material is typically bent away from the plane of the pad.

In one embodiment, the baffle is substantially planar. In this case, and where the pad is also substantially planar, the plane of the baffle is typically perpendicular to the plane of the pad.

Preferably the baffle is positioned between the source and the detector.

In one embodiment, the sensor package further comprises an over-molding substantially covering the radiation source and the radiation detector. Preferably, the over-molding is substantially transparent to the radiation emitted by the radiation source.

The over-molding may comprise a lens covering at least one of the radiation source or the radiation detector. In one embodiment, the over-molding may comprise a collimating lens positioned over the radiation source for substantially collimating radiation emitted by the radiation source. Additionally or alternatively, the over-molding may comprise a collection lens positioned over the radiation detector for focusing incident light onto the radiation detector. The lenses in the over-molding improve the reliability of the proximity sensor and, optionally, can be used to increase its range.

In one embodiment, the collimating lens comprises a Fresnel lens formed in the over-molding. Additionally or alternatively, the collection lens comprises a Fresnel lens formed in the over-molding.

In one embodiment, a gap remains between an upper edge of the baffle and the upper surface of the over-molding. In this case, it is preferable that the over-molding comprises a trench formed above or adjacent the baffle, the trench forming part of the optical isolator. By cutting away the upper surface of the over-molding above the baffle to form the trench, a total internal reflection optical path may be blocked within the sensor package. The combination of the baffle and the trench thus substantially prevents the internal propagation of radiation between the source and the detector within the sensor package. As explained above, this allows the source and the detector to be housed within the same package.

In one embodiment, the trench comprises first and second trench walls. Optionally, the first and second trench walls are substantially perpendicular to each other.

In one embodiment, the bottom of the trench is positioned above an upper surface of the baffle.

Preferably, the bottom of the trench is adjacent an upper surface of the baffle.

In one embodiment, an upper edge of the baffle protrudes through the bottom of the trench. In this case, the first and second trench walls extend from an intermediate portion of the baffle between the plane of the pad and an upper edge of the baffle and, optionally, to the remaining portions of the upper surface of the over-molding.

Preferably the radiation source is a bare die light emitting diode (LED). This provides the manufacturer of the sensor package with greater control to align the radiation source with the detector, without having to account for manufacturing tolerances in the radiation source packaging or in external assembly operations. As indicated above, the bare die LED may be mounted on an interposer mounted on the attachment pad. The interposer may be angled to help angle the emission cone of the source in a desired direction.

In one embodiment the attachment pad is part of a lead frame which forms part of the sensor package.

The radiation detector typically comprises a plurality of light sensitive pixels. In this case, preferably at least one of the pixels is a single photon avalanche detector. Additionally or alternatively, the pixels may comprise any other suitable detectors such as silicon photodiodes configured in photoconductive mode.

A second aspect of the disclosure provides a method of manufacturing a radiation sensor, the method comprising: (a) holding a radiation source and a radiation detector in fixed relation to an attachment pad of a sensor package, the radiation source and/or radiation detector being mounted directly or indirectly on the attachment pad; and (b) adapting a portion of the pad to form a baffle which forms at least part of an optical isolator, the optical isolator substantially preventing the internal propagation of radiation between the source and the detector within the sensor package.

The attachment pad is typically substantially planar.

In one embodiment, step (b) further comprises partially cutting out material from the pad. Typically, step (b) further comprises bending the cut material away from the pad. Most preferably, step (b) comprises partially cutting out material from a portion of the pad adjacent the source and bending the partially cut out material upwards towards the detector.

Preferably, the method according to the second aspect of the disclosure further comprises substantially encapsulating the radiation source, radiation detector and attachment pad in an over-molding. Optionally, the baffle may also be encapsulated. In this case, the method preferably further comprises forming a trench in the over-molding above or adjacent the baffle, the trench forming part of the optical isolator.

Encapsulating the source, detector and attachment pad together allows a bare die light emitting diode (LED) to be mounted to the pad. As explained above, this provides the manufacturer with more control to align the LED with the detector, without having to compensate for manufacturing tolerances in LED packaging or external assembly operations.

BRIEF DESCRIPTION OF THE DRAWINGS

An embodiment of the invention will now be described, by way of example only, with reference to the drawings, in which.

DETAILED DESCRIPTION OF THE DRAWINGS

It is highly desirable for a radiation source and detector of a proximity sensor to be provided in a single package. This would allow close control of the radiation source by circuitry packaged within the detector. In addition, the single proximity sensor package can be provided to a customer as a single working entity.

Figure 1:
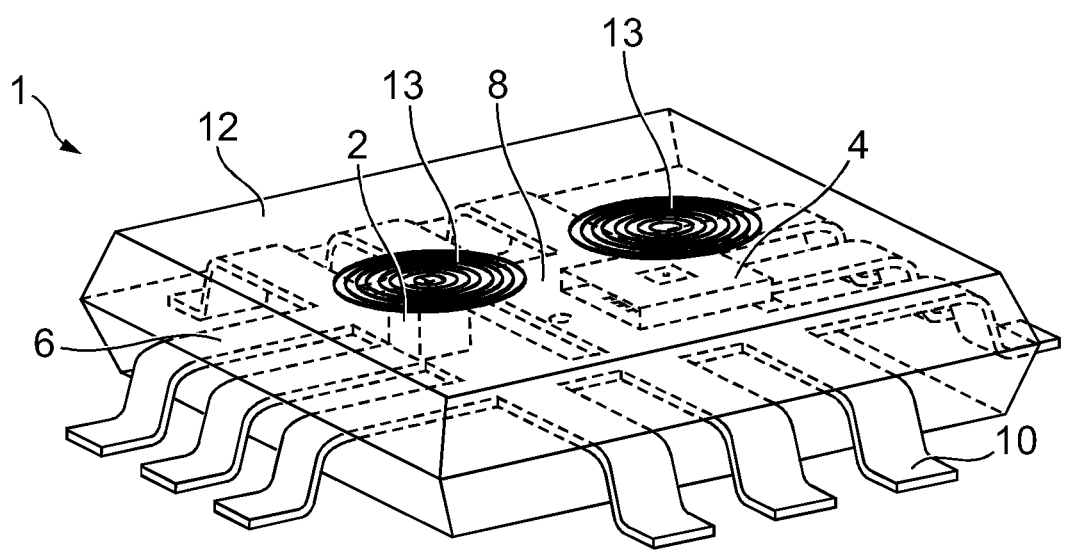
FIG. 1 is a perspective view of a proximity sensor housed within a lead frame style package.

FIG. 1 shows a proximity sensor 1 comprising a radiation source 2 and a radiation detector 4 housed within a single sensor package comprising a wire-lead frame 6. The wire lead frame 6 comprises an attachment pad 8 and twelve pins 10 extending from the attachment pad 8. The radiation source 2 and the radiation detector 4 are mounted on the attachment pad 8 and gold-wire bonded to the pins 10. The sensor package further comprises a thermoset plastic over-molding 12 which encapsulates (and substantially covers) the attachment pad 8, the radiation source 2, the radiation detector 4 and proximal ends of the pins 10 extending from the attachment pad 8. Distal ends of the pins 10 protrude from an external surface of the over-molding 12.

The concentric circles 13 formed above the source 2 and the detector 4 represent Fresnel lenses that can be formed in the over-molding 12. These Fresnel lenses improve the efficiency of the optical system by collimating radiation emitted by the source 2 and focusing incident radiation onto the detector 4.

As explained in the Background section above, the role of the radiation detector 4 is to detect radiation which has been emitted by the radiation source 2 and subsequently reflected back to the detector 4 by an object outside of the sensor package for proximity detection. However, radiation emitted by the source 2 can also propagate onto the detector 4 by internal optical paths within the sensor package, such as total internal reflection paths within the over-molding. This radiation pollutes the response of the radiation detector 4 to the reflected radiation it captures during proximity sensing.

The inventor has discovered that approximately 4% of the radiation emitted by the radiation source 2 from the package shown in FIG. 1 follows internal optical paths within the sensor package to the detector 4. Conversely, approximately $10^{-3}$% of the radiation emitted by the radiation source reflects back to the detector from a Lambertian target of reflectivity of 10% outside the package within the proximity sensing range (typically 0.01 m to 0.5 m). Thus, the reflected signal cannot typically be distinguished from the polluting signal. This makes proximity sensing with the proximity sensor 1 extremely (if not completely) unreliable.

A method of minimizing the amount of radiation which propagates along internal optical paths within the sensor package between the radiation source 2 and the radiation detector 4 is therefore required.

Figure 2:
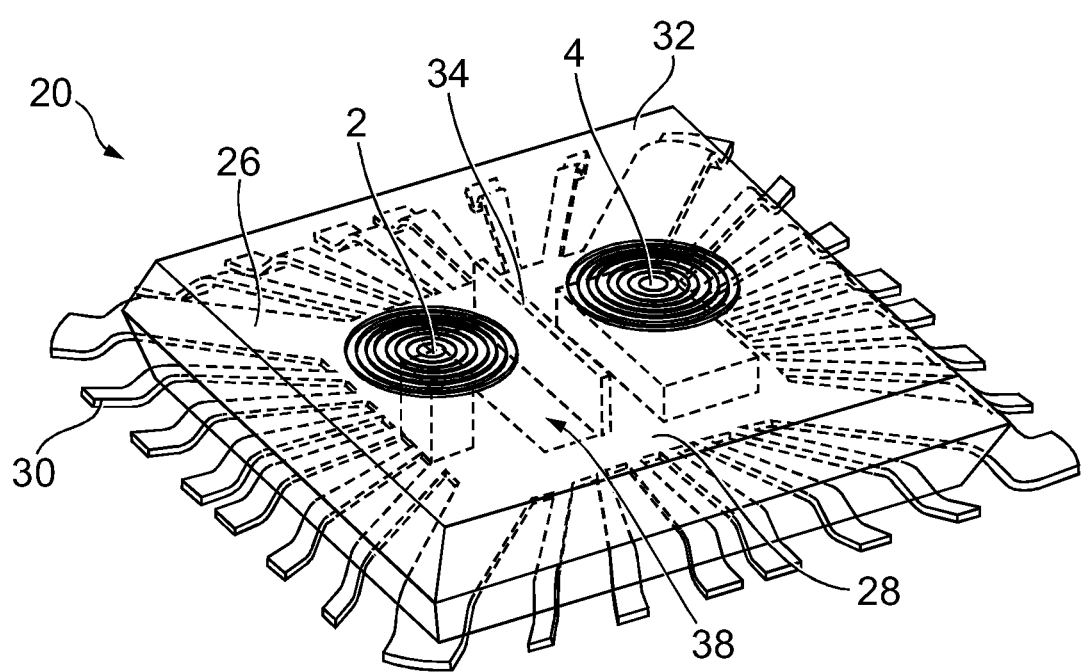
FIG. 2 is a perspective view of a proximity sensor housed within a lead frame style package comprising a baffle extending between the radiation source and the radiation detector.

FIG. 2 shows an alternative proximity sensor 20 comprising a radiation source 2 and a radiation detector 4 housed within a single sensor package comprising a wire-lead frame 26. The wire lead frame 26 comprises a substantially planar attachment pad 28 and twenty eight pins 30 extending from the attachment pad 28. The radiation source 2 and the radiation detector 4 are held in fixed relation to (and are preferably mounted on) the attachment pad 28 and gold-wire bonded to the pins 30. The sensor package further comprises a thermoset plastic over-molding 32 which encapsulates the attachment pad 28, the radiation source 2, the radiation detector 4 and the proximal ends of the pins 30 extending from the attachment pad 28. Distal ends of the pins 30 protrude from an external surface of the over-molding 32. The over-molding is substantially transparent to the radiation emitted by the source 2. It will be understood that one or more lensing elements may be formed in the over-molding over the source 2 to collimate the radiation emitted by the source and/or over the detector 4 to focus incident light onto the detector 4.

A baffle 34, which extends upwards from the plane of the attachment pad 28, is positioned between the radiation source 2 and the detector 4. The baffle 34, which is opaque to the radiation emitted by the radiation source 2, forms at least part of an optical isolator for substantially preventing the internal propagation of radiation between the source 2 and the detector 4 within the sensor package. This significantly reduces the amount of polluting radiation which can propagate directly from the source 2 to the detector 4 without being reflected by an object external to the sensor package.

The baffle 34 may be substantially planar, in which case the plane of the baffle 34 is typically perpendicular to the plane of the attachment pad 28.

The sensor 20 may be manufactured by mounting the source 2 and the detector 4 on the attachment pad 28 of the wire lead frame. The baffle 34 is formed from unused material partially cut out of the plane of the attachment pad 28. In the embodiment shown in FIG. 2, material is partially cut out of the plane of the attachment pad 28 adjacent the radiation source 2 and bent upwards away from the pad 28 towards the detector 4, leaving a cut-out 38 in the attachment pad 28 adjacent the source 2. This can be done during stamping. Next, the pad 28, source 2, detector 4 and baffle 34 are encapsulated in the thermoplastic over-molding.

By forming the baffle 34 from unused material in the attachment pad, the cost of forming the baffle 34 is minimized. In addition, the manufacturing process described above is suited to low cost high volume production.

Figure 3:
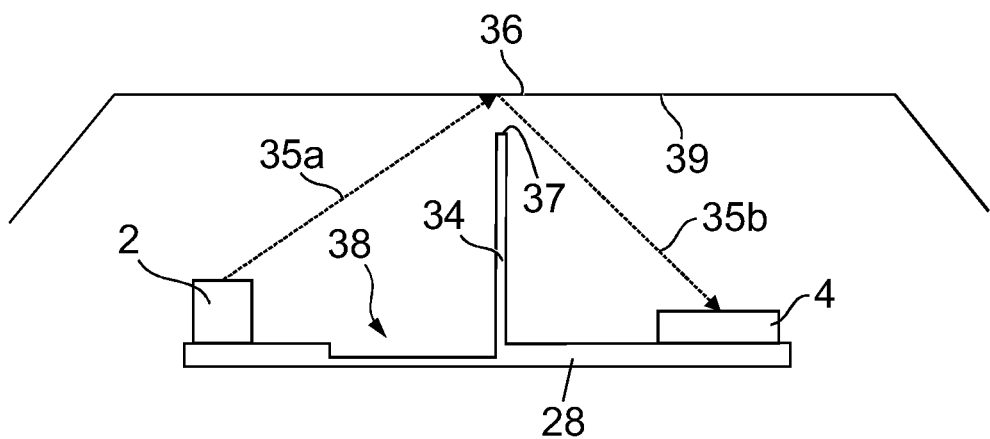
FIG. 3 is a schematic section view of the package of FIG. 2.

To maintain the structural integrity of the package, the baffle 34 may be contained within the upper surface 36 of the over-molding (see FIG. 3). That is, the upper edge 37 of the baffle 34 is positioned beneath the upper surface 36 of the over-molding 32. This is shown most clearly in FIG. 3, which is a schematic section view showing the attachment pad 28, source 2, detector 4, baffle 34, cut-out 38 and the upper surface 36 of the over-molding 32. Despite the baffle 34, an internal optical path 35a, 35b (shown in dotted lines in FIG. 3) remains within the sensor package (substantially within the over-molding) between the source 2 and the detector 4. In particular, radiation emitted by the source 2 along an emission portion 35a of the optical path passes through a gap between the upper edge 37 of the baffle 34 and the upper surface 36 of the over-molding 32 before being totally internally reflected by the underside 39 of the upper surface 36. After total internal reflection, the reflected radiation is directed along a reflection portion 35b of the optical path towards, and ultimately onto, the detector 4. It is noted that internal optical paths other than total internal reflection paths may exist within the sensor package.

Figure 4:
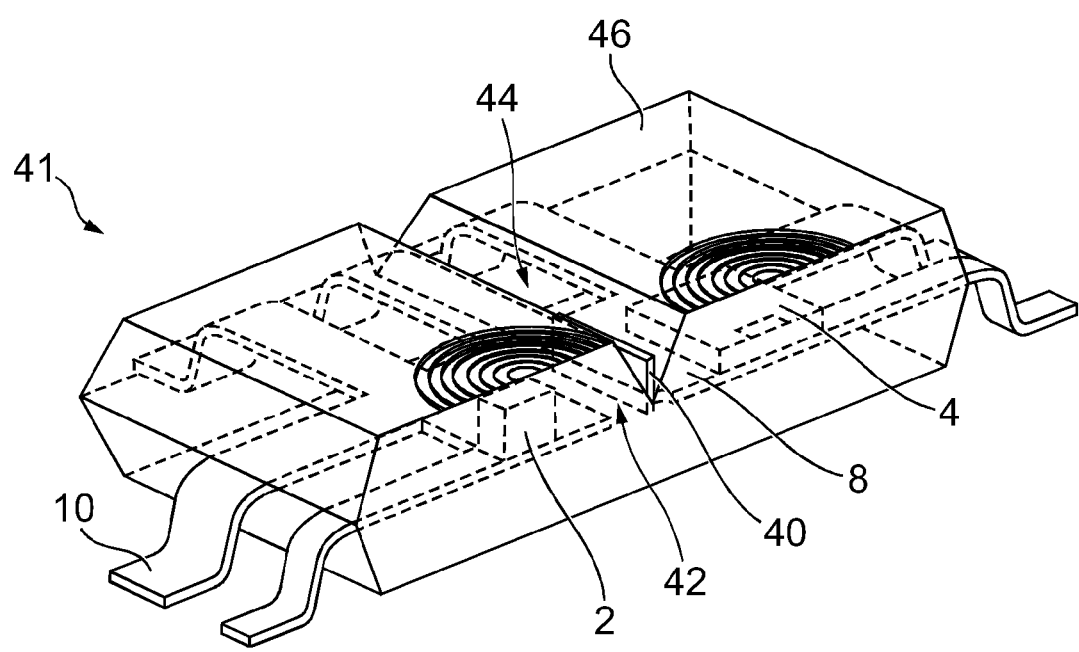
FIG. 4 is a perspective section view of a proximity sensor housed within an adapted version of the lead frame style package of FIG. 1.

FIG. 4 is a perspective section view through another alternative sensor 41 housed in an adapted version of the package of FIG. 1. More specifically, the pad 8 has been adapted to form a baffle 40 between the source 2 and the detector 4. As above, the baffle 40 is formed by partially cutting out unused material in the attachment pad 8 adjacent the source 2, and bending the partially cut out material upwards towards the detector 4. This leaves a cut-out 42 in the attachment pad 8. In addition, a trench 44 is cut out of the upper surface 46 of the over-molding 12. The trench 44 comprises a pair of trench walls 48, 50 (see, also, FIG. 5) which are perpendicular to each other. In the embodiment shown in FIG. 4, the trench walls 48, 50 extend at an (acute) angle from an intermediate position of the baffle 40 between the attachment pad 8 and the upper edge 52 of the baffle 40 to the upper surface 46 of the over-molding 12.

Figure 5:
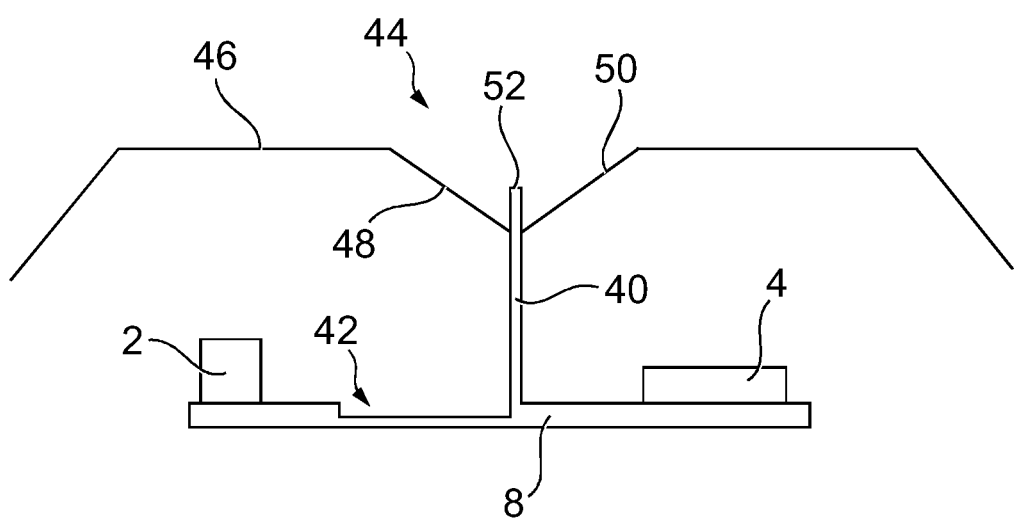
FIG. 5 is a schematic section view of the package of FIG. 4.

As shown most clearly in FIG. 5, the trench 44 is created by cutting out a portion of the upper surface 46 of the over-molding 12. As explained above with respect to the package of FIGS. 2 and 3, before the trench 44 is created, the underside of the cut-out portion of the upper surface 46 acts as a total internal reflection surface creating a single bounce internal optical path 35a, 35b within the sensor package between the source 2 and the detector 4 (as per surface 39 of FIG. 3). However, when the trench 44 is created this internal optical path is substantially removed.

The trench 44 and the baffle 40 together act as an optical isolator for substantially preventing the internal propagation of radiation between the source and the detector within the sensor package. Any radiation emitted by the source 2 towards the baffle 40 may be absorbed by the (opaque) baffle or reflected out of the package or back towards the source 2. In addition, any radiation emitted by the source towards the first trench wall 48 will propagate out of the package. As the first trench wall 48 is substantially perpendicular to the emission portion 35a of the internal optical path 35a, 35b, the total internal reflection of radiation emitted by the source 2 along that path is prevented. In addition, as the second trench wall 50 is substantially parallel to the emission portion 35a of the optical path 35a, 35b, when a radiation ray exits the package through the first trench wall 48, the ray has a grazing incidence with the second trench wall 50. This prevents the ray from being reflected back into the package.

It will be understood that the trench walls 48, 50 may alternatively meet at a trench vertex adjacent the upper edge 52 of the baffle 40. As another alternative, the trench vertex may be positioned above the upper edge 52 of the baffle 40. In this case, a gap would remain between the upper edge 52 of the baffle and the upper surface 46 of the over-molding 12. However, the trench 44 significantly reduces the size of the gap (and thus the amount of radiation passing through the gap from the source 2 to the detector 4).

Although the trench 44 shown in FIGS. 4 and 5 comprises angled trench walls 48, 50 on either side of the baffle 40, the trench 44 may alternatively be provided to one side of the baffle 40.

It will be appreciated that the upper edge 37 of the baffle 34 may be positioned as close as possible (accounting for manufacturing tolerances) to the upper surface 36 of the over-molding 32 to minimize the amount of radiation passing through the gap between the upper edge 37 of the baffle 34 and the upper surface 36 of the over-molding 32. In this case, the trench 44 may not be required as the baffle provides sufficient optical isolation of the source relative to the detector.

By minimizing the amount of radiation which propagates internally within the package between the source 2 and the detector 4, the returned proximity sensing signal can be detected without being significantly distorted. This allows a reliable proximity detector to be provided in a single package, which has the benefits of reducing footprint of the sensor and allowing the source 2 to be controlled by circuitry packaged within the detector 4.

In addition, as the optical isolation is provided by the baffle 40, and optionally the trench 44, no additional components need to be added to the sensor package. That is, internal optical paths are blocked by using unused material in the attachment pad to form the baffle and, optionally, by cutting out material from the over-molding to form the trench. These features can be added by making minor modifications to existing manufacturing processes and without significantly increasing cost.

The baffles 34, 40 extend across only a portion of the width of the attachment pad to maintain the structural integrity of the pad.

The radiation source 2 may be, for example but not exclusively, a modulated light emitting diode (LED) or semiconductor laser, preferably with an emission spectrum in the infrared region of the electromagnetic spectrum. In one embodiment, the radiation source 2 is a bare die light emitting diode (LED). This provides the manufacturer with more control to align the bare die LED with the detector 4 and any lensing elements in the over-molding, without having to compensate for manufacturing tolerances in LED packaging.

The detector 4 preferably comprises an array of light sensitive pixels. The pixels may be, for example, single photon avalanche detectors (see below) or silicon photodiodes configured in photoconductive mode.

Although the sensor packages described above comprise wire lead frames, any other suitable frame structures may be employed.

Figure 6:
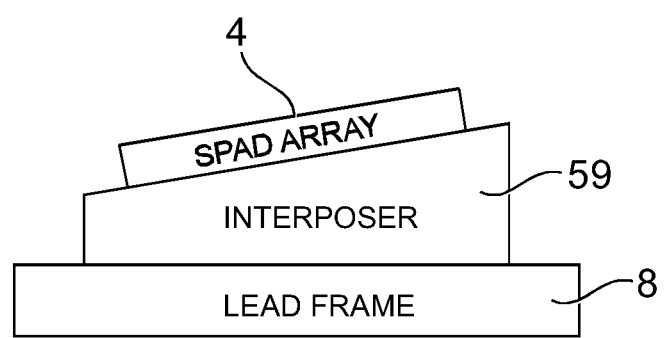
FIG. 6 is a schematic view of a detector mounted on an angled interposer which is mounted on the attachment pad.

It is also noted that the detector 4 need not be directly mounted on the attachment pad 8. For example, FIG. 6 shows a schematic side view of the detector 4 (which in this case is a SPAD array) mounted on an angled interposer 59 which is mounted on the attachment pad 8. The interposer 59 can be used to angle the incident light cone of the detector 4 in a particular direction. It will be understood that, additionally or alternatively, the source 2 may also be mounted on an angled interposer to angle the emission light cone of the source in a particular direction.

Figure 7:
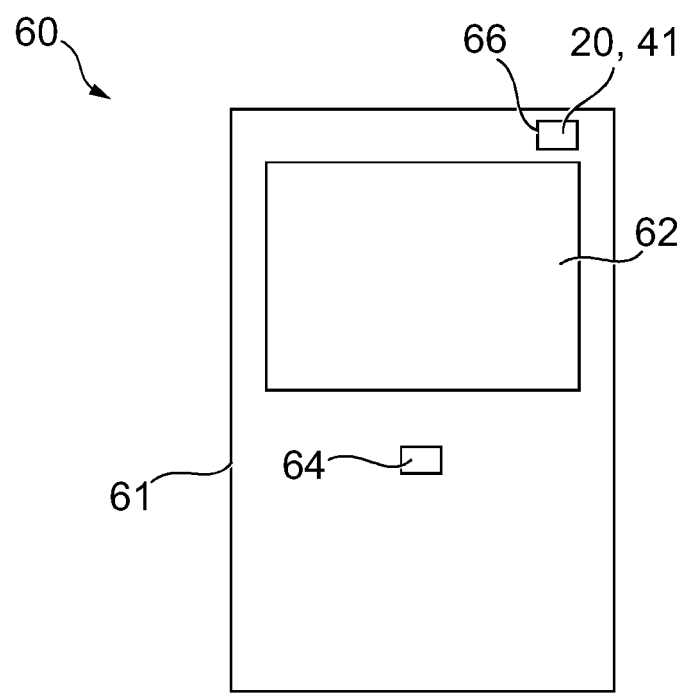
FIG. 7 is a schematic view of a mobile communications device comprising a proximity detector.

The operation of the proximity sensors described above is best explained by means of an example. FIG. 7 shows a mobile communications device 60, such as a mobile phone, mobile smart-phone or PDA, having a housing 61 comprising a display 62, a controller 64 and one of the proximity sensors 20, 41 described above. The source 2 and detector 4 of the proximity sensor 20, 41 are provided under a single common window 66 within the device housing 61.

The proximity sensor 20, 41 can be used to detect the proximity of an object to the mobile communications device 60. This is done by: using the controller 64 to activate the radiation source 2 in order to emit radiation; detecting a portion of the radiation reflected by the object at the detector 4; and processing the reflected radiation with the controller 64 to calculate the proximity of the object to the mobile communications device 60, for example by using a direct time of flight measurement. It will be understood that any other suitable alternative proximity detection mechanism may be used, such as the Phase Shift Extraction Method (see below). If the object is found to be sufficiently close to the mobile communications device, it is assumed that the user is making a call and the controller 64 may switch off the display 62 to save power and/or deactivate one or more user-controls of the device to prevent the user from unintentionally instructing the device to perform a task.

As indicated above, an alternative to the direct time of flight method of proximity sensing is the Phase Shift Extraction Method. In this case, it is preferable that the detector 4 comprises one or more single photon avalanche detectors (SPADs). A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionisation. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger Mode'.

It will be assumed in the description below that the detector comprises one or more SPADs.

It is important to understand the range equation derivation as it indicates the ease of applicability of SPADs to phase extraction proximity detection.

Distance is determined from the speed of light and time of flight (TOF), as follows:

$$s = ct \qquad (1)$$

where s is distance, c the speed of light and t is time.

For a proximity sensing system, the distance is doubled due to the fact there are send and receive paths. As such the distance measured in a ranging system s is given by:

$$s = \tfrac{1}{2} ct \qquad (2)$$

The time shift component (='t') due to the photon TOF, is dependent on the modulation frequency applied to the radiation source and the phase shift magnitude of the waveform (compared to the radiation emitted from the radiation source).

$$t = \% \text{ shift of the returned waveform} \times t_{mod\_period}$$

and if $t_{mod\_period} = 1/f_{mod}$:

$$\Rightarrow t = \frac{\phi}{2\pi} o \frac{1}{f} \qquad (3)$$

$$\Rightarrow t = \frac{\phi}{2\pi o f} \qquad (4)$$

The units are in radians. Then by substituting the above equation back into the starting equation, the 'range equation' is expressed as:

$$\Rightarrow s = \frac{c o \phi}{4\pi o f} \qquad (5)$$

The critical component in this equation is φ, which is the unknown component of the % shift of the returned waveform. The following section discusses how this can be determined.

Figure 8:
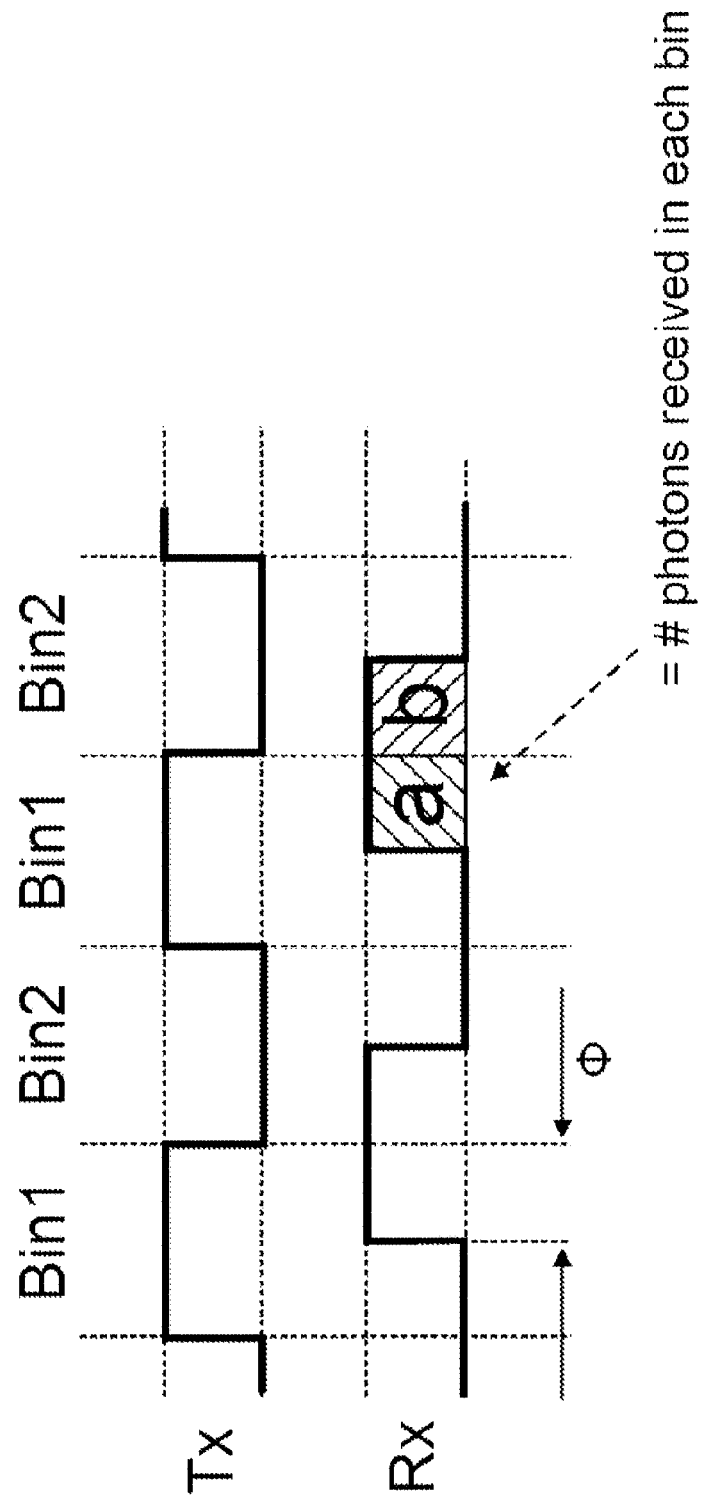
FIG. 8 is a diagram for illustrating the determination of phase shift in a SPAD, in accordance with an embodiment of the disclosure.

Since the values of c, f and π are all constants; the range result simply scales with φ, (the % shift of the received light waveform in relation to that which was transmitted). FIG. 8 demonstrates how φ may be determined for a system employing a square wave modulated radiation source. The transmitted and received waveforms are shifted from one another by φ. By measuring the photons that arrive in "a" and "b" in bins 1 and 2 respectively the value of φ can be determined as follows:

$$\frac{\phi}{2\pi} = \frac{b_{count}}{(a+b)_{count}} \quad (6)$$

In this type of system there is a range limit set by the radiation source modulation frequency, which is known as the unambiguous range. Photons received from targets that are further away than this range can introduce an aliasing error by erroneously appearing in a legitimate bin for a subsequent measurement. Since determination of range is enabled by the modulation process, it is desirable to maximize the number of edges of the modulation waveform in order to accumulate data for averaging purposes as fast as possible. However, a high modulation frequency may lower the unambiguous range and introduces more technical complexity in the driver circuitry of the radiation source. Therefore, two or more different modulation frequencies may be interleaved or used intermittently, so as to reduce or negate the impact of aliased photons via appropriate data processing.

Figure 9:
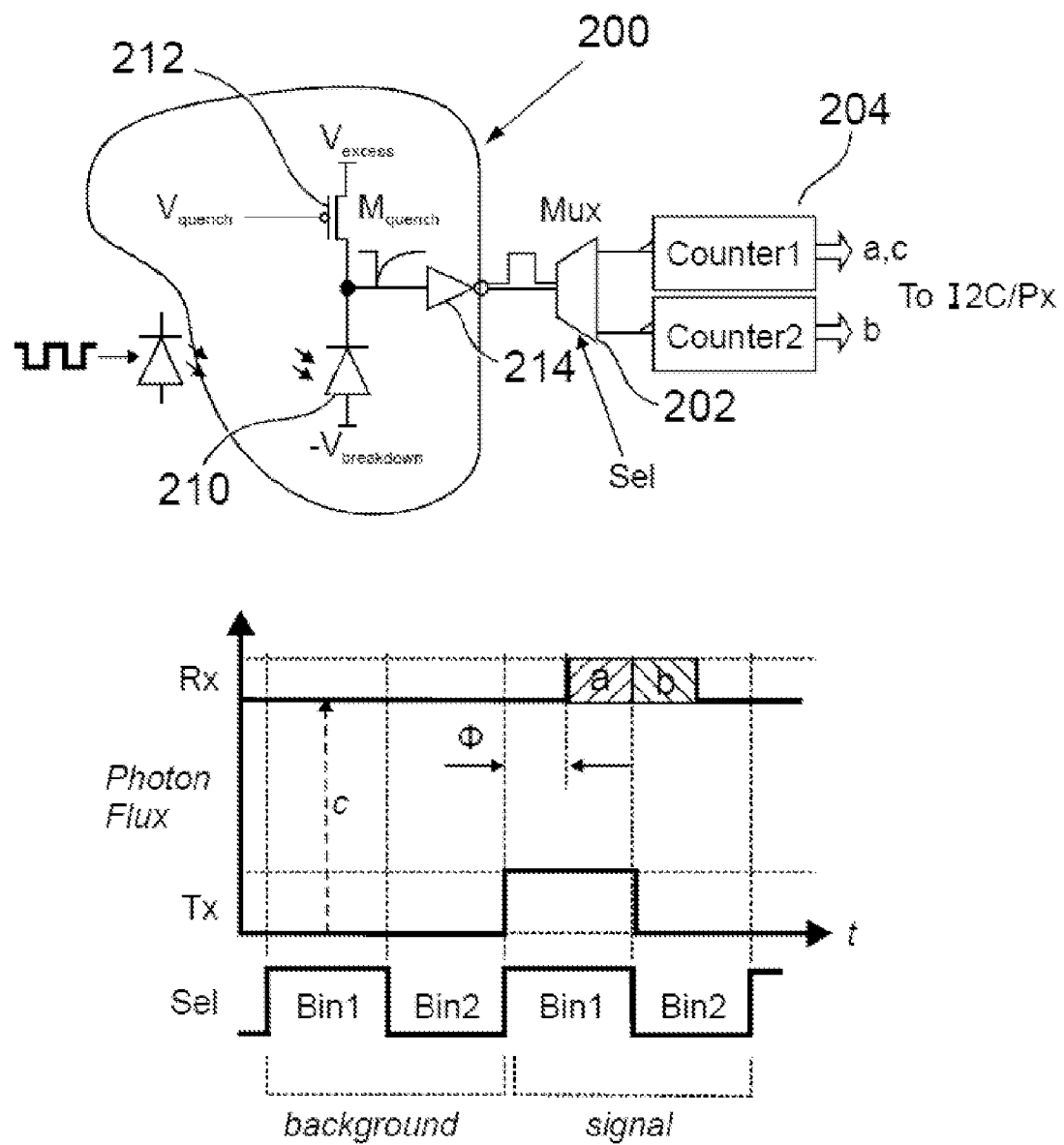
FIG. 9 is a diagram of a SPAD and associated timing diagram, in accordance with an embodiment of the disclosure.

FIG. 9 illustrates a possible implementation of a SPAD based proximity sensor (as part of the proximity sensors 20, 41 described above) with an associated waveform diagram. FIG. 9 shows a SPAD 200 (which forms part of the detector 4) connected to a multiplexer 202. The output from the multiplexer passes through counters 1 and 2 (204). The SPAD shown generally at 200 is of a standard type, including a photo-diode 210, a p-type MOSFET 212 and a NOT gate 214.

The timing waveforms are shown in such a way so as to represent the relative photon arrival magnitudes. It can be seen that an extra phase has been added to enable computation of the background ambient light level offset 'c', although this can be significantly reduced by the use of a narrow optical band-pass filter matched to the wavelength of the radiation source if necessary. The element 'c' is then accommodated in the computation of received light phase shift φ. This measurement of 'c' is then accommodated in the computation of received light phase shift φ. The computed results for a, b, c are determined and written into either a temporary memory store or an I2C register. The computation of the phase shift φ, is calculated as follows:

$$\phi = \frac{a_{count} - c}{(a+b)_{count} - 2c} \quad (7)$$

The predetermined selection of modulation frequency is performed by dedicated logic or host system which selects a suitable frequency or frequencies for the application of the range sensor. The proximity sensor of FIG. 9 is dependent on the amount of light that can be transmitted on to the scene, system power consumption and the target reflectivity.

Figure 10:
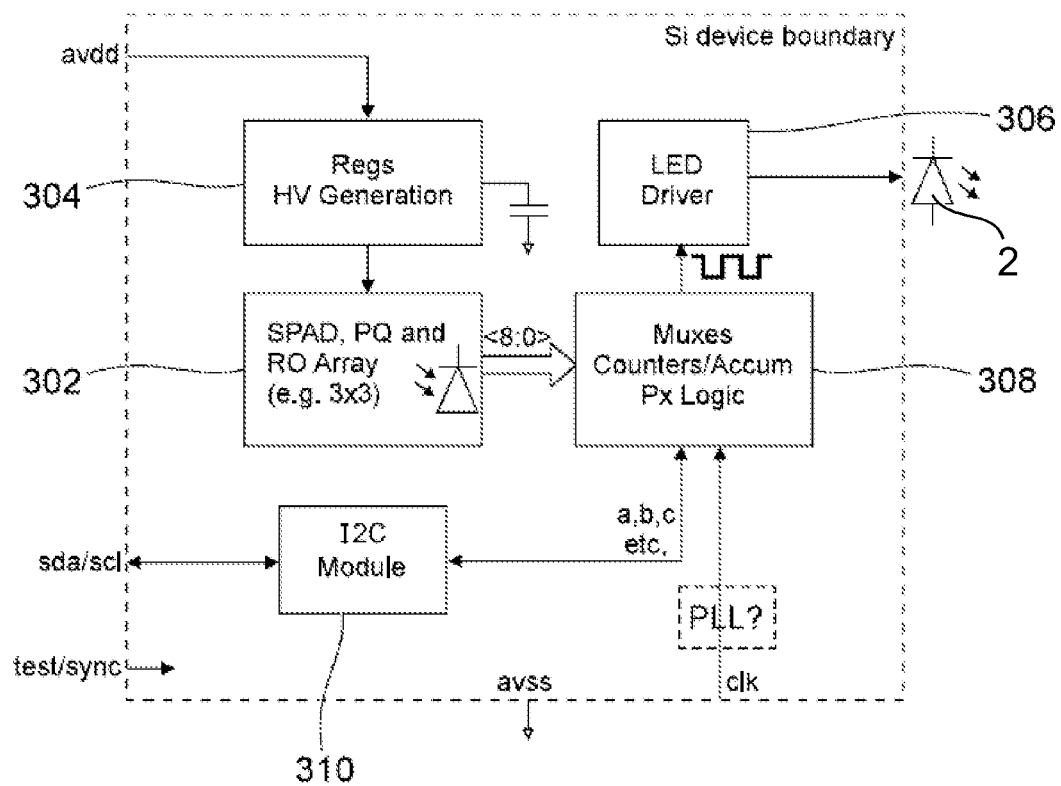
FIG. 10 is a block diagram of a proximity detector, in accordance with an embodiment of the disclosure.

A block diagram of the required elements for the proximity sensor 20, 41 is shown in FIG. 10 when the detector 4 comprises one or more SPADs. The proximity sensor includes a SPAD function and the quenching thereof in block 302. The quenching can be passive as shown or of any other suitable type. The bias voltage for the SPAD may be provided by a charge pump or any other suitable device 304. The sensor also includes the radiation source 2 (such as an LED or semiconductor laser) and an associated driver 306 for applying the required modulation to the radiation source 2.

The sensor may include a distance computation logic module to determine range. Alternatively this can be located in the mobile communications device 60, optionally as part of the controller 64. The sensor also includes multiplexers and counters 308 and a storage means 310, such as a I2C module. The sensor may also include a Phase Locked Loop (PLL) for clocking and subsequent timed signal generation purposes.

The power consumption of SPADs and their readout circuits is dependent on the incident photon arrival rate. The average power consumption of the proximity sensing function could be reduced by using power saving modes such as pulsed on/off operation, at a rate of ~10 Hz for example, at the expense of target motion distortion.

The SPADs may be implemented on a 1 mm$^2$ die size and the I2C module could also be implemented on an appropriate die. Optimally the detector 4 has a field of view of about 30°.

It should be noted that the terms "optical", "illumination" and "light" are intended to cover other wavelength ranges in the electromagnetic spectrum and are not limited to the visual spectrum.

While this detailed description has set forth some embodiments of the present disclosure, the appended claims cover other embodiments of the present disclosure which may differ from the described embodiments according to various modifications and improvements.

What is claimed is:

1. A proximity sensor comprising: a sensor package having an attachment pad; a radiation source and a radiation detector housed within the sensor package using a substantially transparent over-molding, the source and the detector being held in a fixed relation to the attachment pad, wherein a portion of the attachment pad is adapted to form a baffle which forms at least part of an optical isolator, and wherein the baffle comprises material at least partially cut out from the pad, the optical isolator adapted to substantially prevent internal reflection within the substantially transparent over-molding between the source and the detector, and wherein at least one of the source and detector are one of directly and indirectly mounted on the attachment pad.

2. The proximity sensor of claim 1 wherein the attachment pad is substantially planar.

3. The proximity sensor of claim 2 wherein the baffle extends out from the plane of the pad.

4. The proximity sensor of claim 1 further comprising a bend in the partially cut out material away from the plane of the pad.

5. The proximity sensor of claim 1 wherein the baffle is substantially planar.

6. The proximity sensor of claim 5 wherein the plane of the baffle is perpendicular to the plane of the pad.

7. The proximity sensor of claim 1 wherein the baffle is positioned between the source and the detector.

8. The proximity sensor of claim 1 wherein the substantially transparent over-molding substantially covers the radiation source and the radiation detector.

9. The proximity sensor of claim 1 wherein the over-molding is substantially transparent to the radiation emitted by the radiation source.

10. The proximity sensor of claim 1 wherein the over-molding comprises a lens covering at least one of the radiation source or the radiation detector.

11. The proximity sensor of claim 1 wherein the over-molding comprises a collimating lens positioned over the radiation source for substantially collimating radiation emitted by the radiation source.

12. The proximity sensor of claim 11 wherein the collimating lens comprises a Fresnel lens formed in the over-molding.

13. The proximity sensor of claim 1 wherein the over-molding comprises a collection lens positioned over the radiation detector for focusing incident light onto the radiation detector.

14. The proximity sensor of claim 13 wherein the collection lens comprises a Fresnel lens formed in the over-molding.

15. The proximity sensor of claim 1 wherein the radiation source is a bare die light emitting diode.

16. The proximity sensor of claim 1 wherein the attachment pad is part of a lead frame which forms part of the sensor package.

17. The proximity sensor of claim 1 wherein the radiation detector comprises a plurality of light sensitive pixels.

18. The proximity sensor of claim 17 wherein at least one of the pixels is a single photon avalanche detector.

19. The proximity sensor of claim 1 wherein at least one of the source and the detector are mounted on an interposer which is mounted on the attachment pad.

20. The proximity sensor of claim 19 wherein an upper surface of the interposer to which the one of the source and detector are mounted is angled relative to a plane of the attachment pad.

21. A proximity sensor comprising: a sensor package having an attachment pad; a radiation source and a radiation detector housed within the sensor package using an over-molding, the source and the detector being held in a fixed relation to the attachment pad, wherein a portion of the attachment pad is adapted to form a baffle which forms at least part of an optical isolator, the optical isolator adapted to substantially prevent internal reflection between the source and the detector within the sensor package, wherein the over-molding comprises a trench formed above or adjacent the baffle, the trench forming part of the optical isolator, and wherein at least one of the source and detector are one of directly and indirectly mounted on the attachment pad.

22. The proximity sensor of claim 21 wherein the trench comprises first and second walls.

23. The proximity sensor of claim 22 wherein the first and second trench walls are substantially perpendicular to each other.

24. The proximity sensor of claim 21 wherein the bottom of the trench is positioned above an upper surface of the baffle.

25. The proximity sensor of claim 21 wherein the bottom of the trench is adjacent an upper surface of the baffle.

26. The proximity sensor of claim 21 wherein an upper edge of the baffle protrudes through the bottom of the trench.

27. The proximity sensor of claim 26 wherein the first and second trench walls extend from an intermediate portion of the baffle between the plane of the pad and an upper edge of the baffle.

28. A method of manufacturing a radiation sensor, the method comprising:
(a) holding a radiation source and a radiation detector in fixed relation to an attachment pad of a sensor package using a substantially transparent over-molding, at least one of the radiation source and the radiation detector being one of directly and indirectly mounted on the attachment pad; and
(b) adapting a portion of the attachment pad to form a baffle which forms at least part of an optical isolator, wherein the baffle comprises material at least partially cut from the attachment pad, the optical isolator substantially preventing internal reflection within the substantially transparent over-molding between the source and the detector within the sensor package.

29. The method of claim 28 wherein the pad is substantially planar.

30. A method of manufacturing a radiation sensor, the method comprising:
(a) holding a radiation source and a radiation detector in fixed relation to an attachment pad of a sensor package, at least one of the radiation source and the radiation detector being one of directly and indirectly mounted on the attachment pad; and
(b) partially cutting out material from the attachment pad to form a baffle which forms at least part of an optical isolator, the optical isolator substantially preventing internal propagation of radiation between the source and the detector within the sensor package.

31. The method of claim 30 wherein step b further comprises bending the cut material away from the attachment pad.

32. A method of manufacturing a radiation sensor, the method comprising:
(a) holding a radiation source and a radiation detector in fixed relation to an attachment pad of a sensor package, at least one of the radiation source and the radiation detector being one of directly and indirectly mounted on the attachment pad; and
(b) partially cutting out material from a portion of the attachment pad adjacent the source; and
(c) bending the partially cut out material upwards towards the detector to form an optical isolator substantially preventing internal propagation of radiation between the source and the detector within the sensor package.

33. The method of any of claim 28 further comprising substantially encapsulating the radiation source, radiation detector and attachment pad in an over-molding.

34. The method of claim 33 further comprising forming a trench in the over-molding above or adjacent the baffle, the trench forming part of the optical isolator.

35. The method of claim 28, wherein the baffle further comprising a bend in the partially cut out material away from the plane of the pad.

* * * * *